United States Patent
Beaulieu et al.

(10) Patent No.: US 6,993,405 B2
(45) Date of Patent: Jan. 31, 2006

(54) MANUFACTURING PRODUCT CARRIER ENVIRONMENT AND EVENT MONITORING SYSTEM

(75) Inventors: Mark E. Beaulieu, Milton, VT (US); James A. Bostwick, South Alburg, VT (US); Scott A. Cummings, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,912

(22) Filed: Nov. 5, 2003

(65) Prior Publication Data

US 2005/0096776 A1  May 5, 2005

(51) Int. Cl.
*G06F 19/00* (2006.01)

(52) U.S. Cl. .................. 700/116; 700/115; 700/112; 700/213; 700/214; 700/219; 700/228; 198/300; 198/301

(58) Field of Classification Search .................. 700/95, 700/96, 104, 108, 112, 115, 113, 117, 213, 700/214, 217, 218, 219, 228; 198/300, 301
See application file for complete search history.

(56) References Cited

U.S. PATENT DOCUMENTS

| | | | |
|---|---|---|---|
| 5,166,884 A | | 11/1992 | Maney et al. |
| 5,867,388 A | * | 2/1999 | Okumura et al. ........... 700/112 |
| 6,078,845 A | * | 6/2000 | Friedman ..................... 700/104 |
| 6,138,058 A | | 10/2000 | Van Antwerp, Jr. et al. |
| 6,148,245 A | * | 11/2000 | Lynch et al. ................. 700/115 |
| 6,236,903 B1 | * | 5/2001 | Kim et al. .................... 700/121 |
| 6,449,522 B1 | * | 9/2002 | Conboy et al. ............. 700/121 |
| 6,570,508 B1 | | 5/2003 | Kvenvold |
| 6,618,640 B1 | * | 9/2003 | Hittner et al. ............... 700/116 |
| 6,839,604 B2 | * | 1/2005 | Godfrey et al. ............. 700/116 |
| 6,839,713 B1 | * | 1/2005 | Shi et al. ..................... 707/101 |
| 2003/0102367 A1 | | 6/2003 | Monette et al. |

FOREIGN PATENT DOCUMENTS

| | | |
|---|---|---|
| WO | WO 02/15234 A2 | 2/2002 |
| WO | WO 02/065509 A1 | 8/2002 |

* cited by examiner

*Primary Examiner*—Ramesh Patel
(74) *Attorney, Agent, or Firm*—Schmeiser, Olsen & Watts; Anthony Canale

(57) ABSTRACT

An apparatus, method and system for monitoring the environment surrounding a product in a product carrier and events affecting the product carrier and product in the product carrier during manufacture of the product. The apparatus including: a product carrier adapted to transport product undergoing manufacture; and a first device adapted to sense an attribute of an environment within the product carrier or an event affecting the product carrier.

25 Claims, 8 Drawing Sheets

FIG. 2A     FIG. 2B

MANUFACTURING PRODUCT CARRIER ENVIRONMENT AND EVENT MONITORING SYSTEM

BACKGROUND OF INVENTION

1. Field of the Invention

The present invention relates to the field of monitoring a product during manufacture; more specifically, it relates to an apparatus, method and system for monitoring the environment surrounding a product and events affecting the product while in a product carrier during manufacture of the product.

2. Background of the Invention

During manufacture of products that are stored and transported in product carriers between process tools, the environment seen by the product is different in many respects from the room environment, especially when the carrier is sealed from the room environment. Further, changes to the environment within the carrier and events affecting the carrier and product within the carrier while the product is being transported in the carriers are largely unmonitored. Undetected within product carrier environmental changes and undetected events experienced by the carrier and the product within the carrier can cause product yield loss or reliability fails that are very difficult to detect because there is no record of those environmental changes or events affecting. Therefore, there is a need for an apparatus, method and system for monitoring the environment surrounding a product in a product carrier and events affecting the product carrier and the product in the product carrier during manufacture of the product.

SUMMARY OF INVENTION

A first aspect of the present invention is an apparatus, comprising: a product carrier adapted to transport product undergoing manufacture; and a first device adapted to sense an attribute of an environment within the product carrier or an event affecting the product carrier.

A second aspect of the present invention is a method of monitoring an internal environment of a product carrier or events affecting the product carrier in a manufacturing facility, comprising: providing the product carrier, the product carrier transporting product undergoing manufacture; and providing a first device sensing an attribute of the internal environment of the product carrier or an event affecting the product carrier.

A third aspect of the present invention is a manufacturing system comprising: a multiplicity of manufacturing tools; a multiplicity product carriers having micro-sensors, each product carrier adapted to transport product undergoing manufacture between the manufacturing tools and each micro-sensor adapted to sense at least one attribute of an environment within each product carrier or an event affecting each product carrier and adapted to transmit date and time stamped product carrier identity and attribute and event data; and one or more receiving stations, each receiving station adapted to receive the product carrier identity and attribute and event data from the microsensor.

A fourth aspect of the present invention is a method of monitoring an internal environment of a product carrier or events affecting the product carrier in a manufacturing facility comprising a multiplicity of manufacturing tools, the method comprising: providing a multiplicity product carriers having micro-sensors, each product carrier adapted to transport product undergoing manufacture between the manufacturing tools and each micro-sensor adapted to sense at least one attribute of an environment within each product carrier or an event affecting each product carrier and adapted to transmit date and time stamped product carrier identity and attribute and event data; and providing one or more receiving stations, each receiving station for receiving the product carrier identity and attribute and event data from the micro-sensor.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 2A, 2B, 2C and 2D illustrate exemplary methods of mounting a micro-sensor to the product carrier of FIGS. 1A and 1B;

DETAILED DESCRIPTION

The method and system for monitoring the environment surrounding a product and events affecting the product while in a product carrier during manufacture of the product will be described using an exemplary application of the present invention to a semiconductor manufacturing line manufacturing integrated circuits on wafers. In a semiconductor manufacturing line, the product is built from blanks called semiconductor substrates or wafers and the product carriers are termed wafer carriers (also called pods). Examples of semiconductor substrates include bulk silicon substrates, silicon on insulator (SOI) substrates and sapphire, ruby and silicon-germanium substrates. The present invention may be applied to the manufacture of other products including examples of which include photolithography masks, photolithography reticules, semiconductor modules (or packages), circuit boards, magnetic disks, magnetic hard drive disks, magnetic floppy disks and optical disks such as laser disks, compact disks and digital video disks, lenses and mirrors, wherein their corresponding substrates are transported and/or stored in appropriate product carriers.

For the purposes of the present invention, a product carrier in general and a wafer carrier in particular may be fully sealable (airtight) against manufacturing area atmosphere, may be open to manufacturing area atmosphere, may be totality light tight, or block only certain light wavelengths (such as ultraviolet), may block radio frequency radiation, may provide vibration and shock isolation or combinations of the above. For the purposes of the present invention, a controlled environment is defined as an environment in which one or more of temperature, humidity, chemical composition of the atmosphere, atmospheric pressure (including partial vacuums), particulate count or combinations of the above are controlled.

Figure 1A:
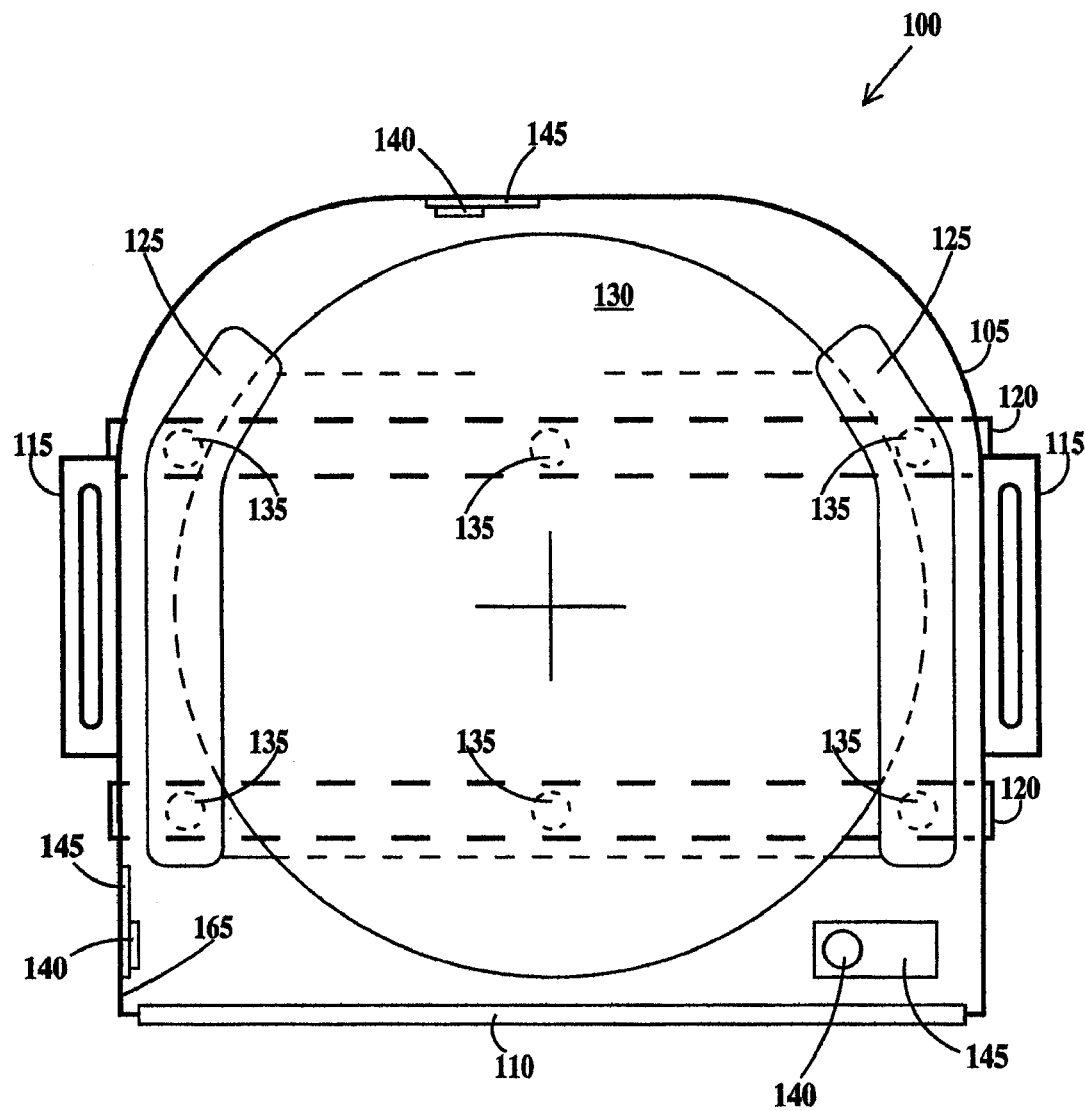
FIG. 1A is a top view of an exemplary product carrier according to the present invention.
Figure 1B:
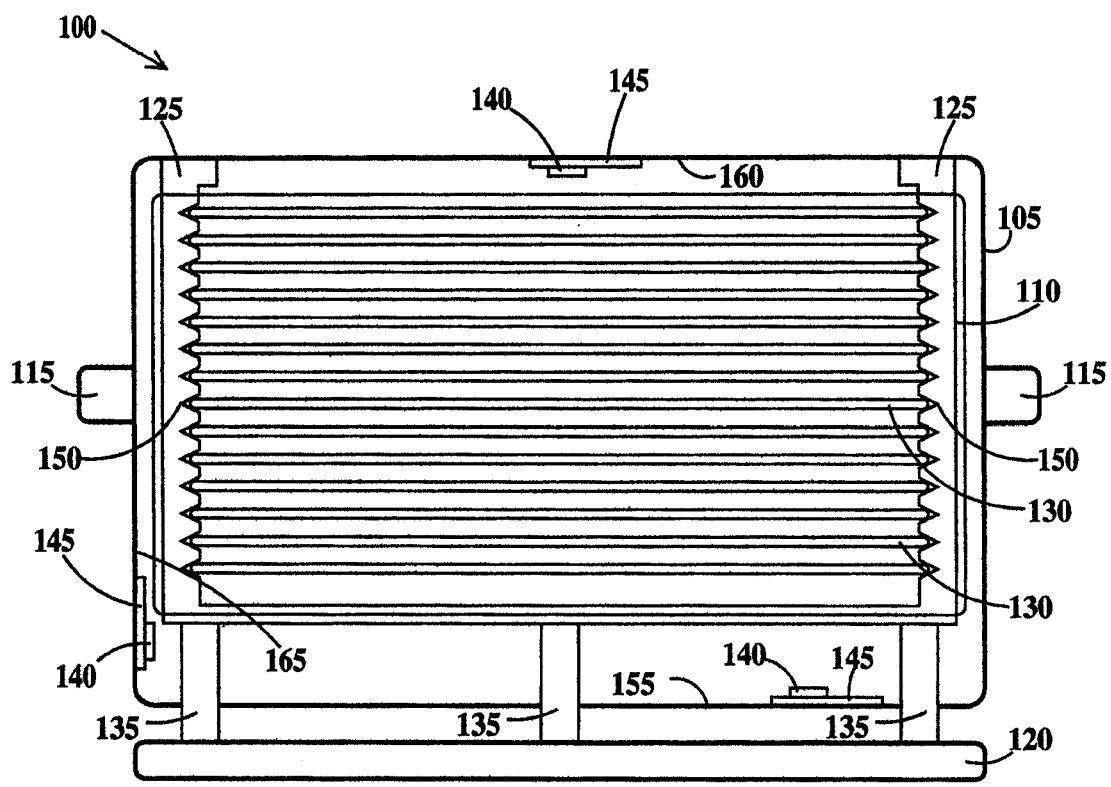
FIG. 1B is a front view of the product carrier of FIG. 1A.

FIG. 1A is a top view and FIG. 1B is a front view of an exemplary product carrier according to the present invention. In FIG. 1, a wafer carrier (or pod) 100 includes an case 105 having a door 110, handles 115, and feet 120 connected to a cassette 125 by pins 135. Cassette 125 is adapted to hold one or more wafers 130. There are many types of wafer carriers 100. One example of a wafer carrier is a front opening unified pod or FOUP. A second example of a wafer carrier is standard mechanical interface or SMIF. Both FOUPs and SMIFs are commercially available, well known in to one of ordinary skill in the art and easily modified, if required, for the purposes of the present invention. Mounted inside wafer carrier 105 are one or more wireless micro-sensors 140, which in turn may be mounted on expansion cards 145. Wafers 130 are slidably held in grooves 150 in cassette 125. Micro-sensors 140 are also known in the art as motes.

Wafer carriers 100 may be designed to be openable only by a load/unload tool in a controlled environment or by a load/unload station of a process, measurement or inspection tool.

Wafer carrier 100, may be fabricated from sheet metal, clear, colored or opaque plastic, or a metal or plastic mesh. Wafers 130 may be any diameter including 100 mm, 150 mm, 200 mm, 300 mm and 450 mm. Micro-sensors 140 and optional expansion cards 145 are illustrated in FIGS. 3, 4A, 4B and 4C and described infra.

Figure 2C:
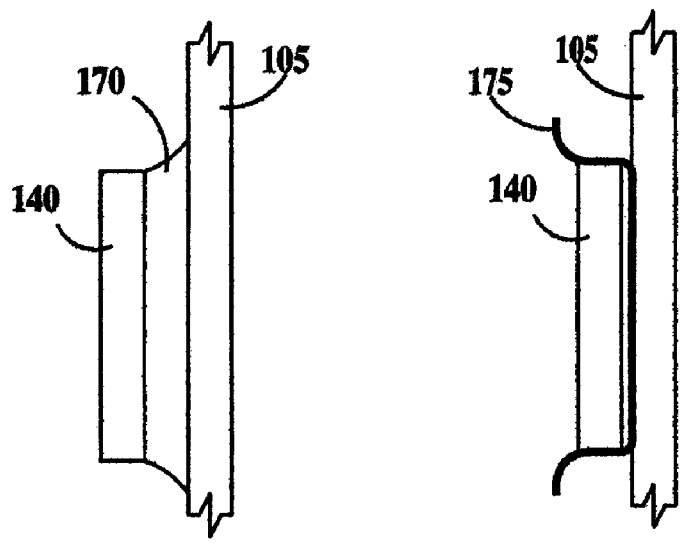
Figure 2C:
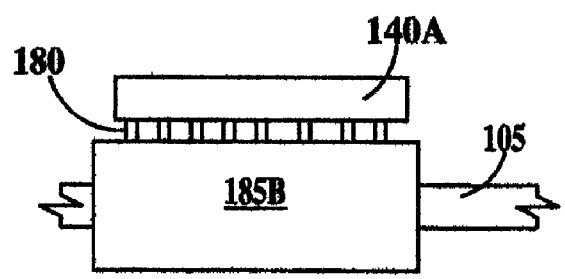

As is evident from FIGS. 1 and 2, micro-sensors 140 or expansion cards 145 may be mounted on an inside bottom surface 155, inside top surface 160 or on the inside surface of one or more sides 165 of wafer carrier 100 or any combination of top, bottom and side surfaces.

FIGS. 2A, 2B, 2C and 2D illustrate exemplary methods of mounting micro-sensor 140 (or expansion card 145) to product carrier 100. In FIG. 2A, micro-sensor 140 is mounted to case 105 of wafer carrier 100 (see FIGS. 1A and 1B) by an adhesive 170. Alternatively, a micro-sensor 140 may be mounted on an expansion card 145 (see FIGS. 1A and 1B) and the expansion card mounted to case 105 by adhesive 170.

In FIG. 2B, micro-sensor 140 is mounted to case 105 of wafer carrier 100 (see FIGS. 1A and 1B) by spring clip 175 mounted to case 105. Alternatively, a micro-sensor 140 may be mounted on an expansion card 145 (see FIGS. 1A and 1B) and the expansion card mounted to case 105 (see FIGS. 1A and 1B) by spring clip 175. Virtually any mechanical means may be used to mount a micro-sensor or an expansion card to case 105.

In FIG. 2C, a micro-sensor 140A is plugged into an optional socket 185B embedded in case 105 using conductive pins 180, to provide external electrical access to the micro-sensor.

Figure 2D:
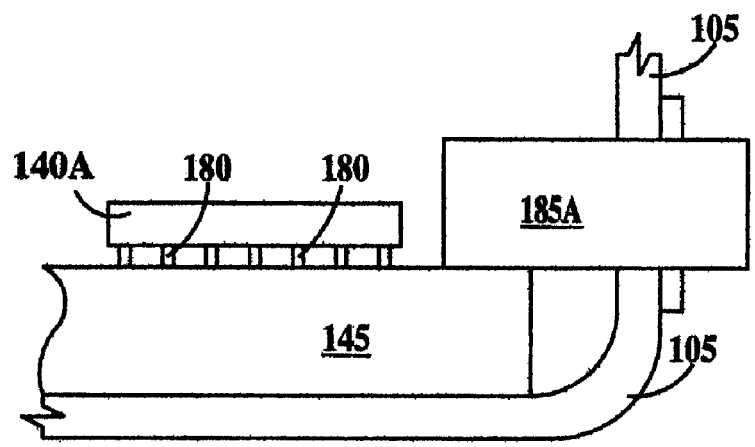

In FIG. 2D, micro-sensor 140A is physically mounted and electrically connected to expansion card 145 by conductive pins 180. Expansion card 145 is mounted to case 105 of wafer carrier 100 (see FIGS. 1A and 1B) by either adhesive or mechanical means. An optional socket 185A electrically connected to expansion card 145 protrudes through case 105 and provides means for reading data collected by micro-sensor 140 or expansion card 145 (even though the micro-sensor can broadcast its data to a receiving station as described infra) or means for programming or testing the micro-sensor and/or expansion card.

Figure 3:
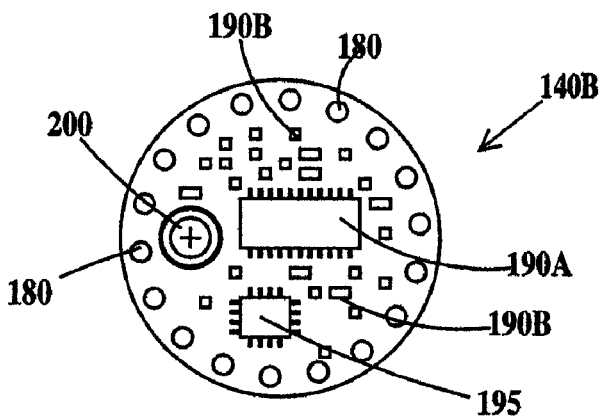
FIG. 3 is a detailed top view of an exemplary micro-sensor that may be incorporated in the product carrier of FIGS. 1A and 1B.

FIG. 3 is a detailed top view of an exemplary micro-sensor that may be incorporated in the product carrier of FIGS. 1A and 1B. In FIG. 3, exemplary micro-sensor 140B includes pins 180 for electrically connecting the microsensor to other devices, a multiplicity of integrated circuits 190A and discrete circuit elements 190B making up circuits illustrated in FIG. 5 and described infra, one or more sensors 195 and a battery 200. Integrated circuits 190A and discrete circuit elements 190B, conductive pins 180 and sensors 195 many be mounted to both a topside and a bottom side of micro-sensor 140B. Micro-sensor 140B includes both sensor and radio transceiver functions though micro-sensors having only the transmit function may be used in the present invention. Receiving stations are described infra. In one example, micro-sensor 140B may transmit and/or receive over a range of about 150 to 300 meters.

Note, that the only difference between micro-sensor 140 (see FIG. 2A), micro-sensor 140A (see FIG. 2C) and micro-sensor 140B (see FIG. 4B) is the presence (or absence) and location of conductive pins 180. Micro-sensor 140 (see FIG. 2A) has no conductive pins 180. Micro-sensor 140 (see FIG. 2A) has conductive pins 180 only on a top surface. Micro-sensor 140 (see FIG. 2A) has conductive pins 180 on top and bottom surfaces.

Figure 5:
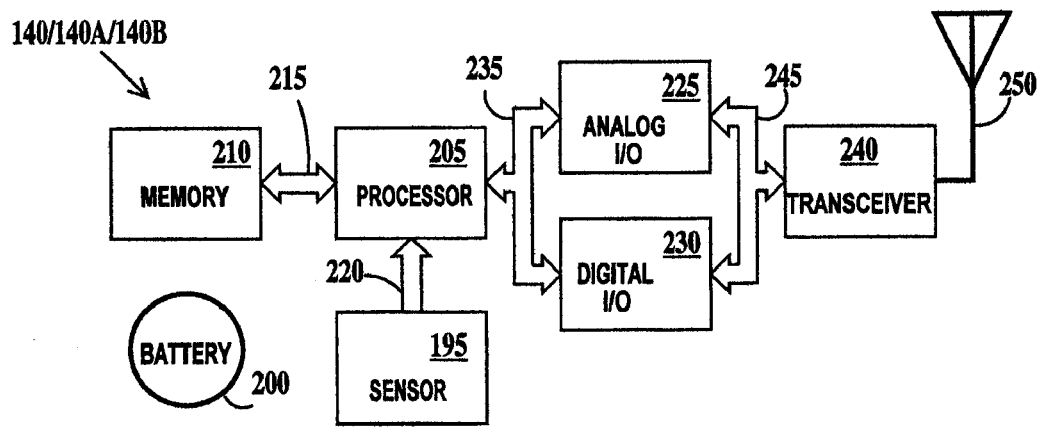
FIG. 5 is a block schematic diagram of the micro-sensor of FIG. 3.

Turning to FIG. 5, micro-sensor 140/140A/140B includes a processor 205 connected to a memory 210 by a bus 215, a sensor 195 connected to processor 205 by a bus 220, an analog I/O circuit 235 and/or a digital I/O circuit 230 both connected to processor 205 by a bus 235 and to a transceiver 240 by a bus 245. Transceiver 240 has an antenna 250 for transmitting sensor readings and optionally for receiving programming or control signals, such as on, off, reset, test and poll. In certain applications, transceiver 240 can be replaced with a transmitter without receiving capability. Micro-sensor 140/140A/140B may continuously send back real-time sensor data, may send back real-time data periodically, send back stored data periodically, or send back stored data only when polled. Micro-sensor 140/140A/140B may also send out a location beacon in response to a poll signal. Micros-sensor 140/140A/140B may have the ability to send back data from multiple sensors either in a coded data stream or on several frequencies at the same time. Sensor 140/140A/140B is powered by rechargeable and/or replaceable battery 200.

Examples of a micro-sensor are the Mica2 Dot wireless micro-sensor motes models MPR500CA and MPR510CA manufactured by Crossbow Technology, Inc. of San Jose Calif.

Figure 4A:
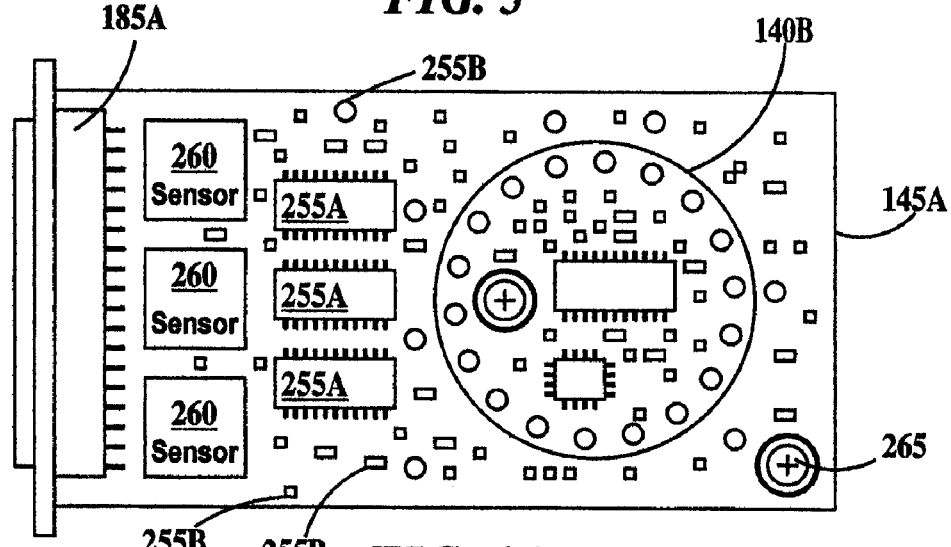
FIG. 4A is a detailed top view of the micro-sensor mounted of FIG. 3 mounted on an exemplary optional expansion card.

FIG. 4A is a detailed top view of micro-sensor 140A mounted on an exemplary optional expansion card 145B that may be incorporated into wafer carrier 100 (see FIGS. 1A and 1B). Because of the small size of micro-sensor 140B, about 25 mm in diameter or smaller (though they my be any convenient size), sensor 195 (see FIG. 3) may be limited to a simple sensor such as a temperature sensor through other sensor types are possible. In FIG. 4A, expansion card 145A includes sockets (not shown) for electrically connecting the expansion card to micro-sensor 140B, a multiplicity of integrated circuits 255A and discrete circuit elements 255B, one or more additional sensors 260, an optional additional battery 265 and an optional socket 185A. Integrated circuits 255A and discrete circuit elements 255B and sensors 260 many be mounted to both a topside and a bottom side of expansion card 145A. An examples of an expansion cards are the Mica2 Dot model MDA500CA prototype data acquisition board manufactured by Crossbow Technology, Inc. of San Jose Calif., which may be modified by the user to incorporate user defined sensors.

Figure 4B:
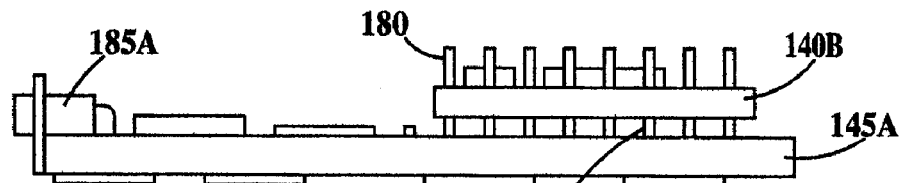
FIG. 4B is a side view of the exemplary micro-sensor and expansion card FIG. 4A.

FIG. 4B is a side view of micro-sensor 140B and expansion card 145A. In FIG. 4B, micro-sensor 140B is mounted and electrically connected to expansion card 145A by pins 180. Expansion card 145A includes an optional socket 185B.

Figure 4C:
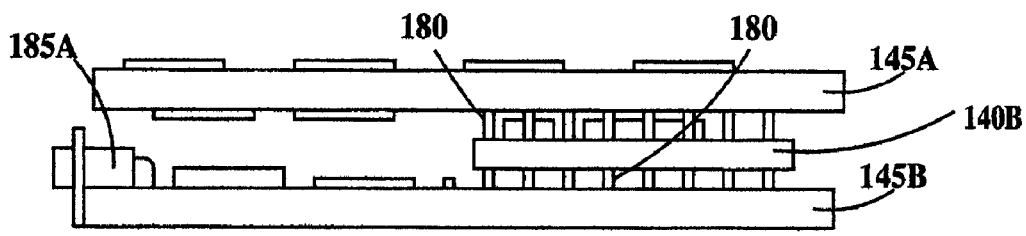
FIG. 4C is a side view of the exemplary micro-sensor of FIG. 3 mounted to multiple optional sensor and expansion cards.

FIG. 4C is a side view of micro-sensor 140B mounted to two expansion cards 145A and 145B. In FIG. 4C, microsensor 140B is mounted between and electrically connected to expansion cards 145B and 145B by pins 180. Expansion card 145A includes an optional socket 185B.

Figure 6:
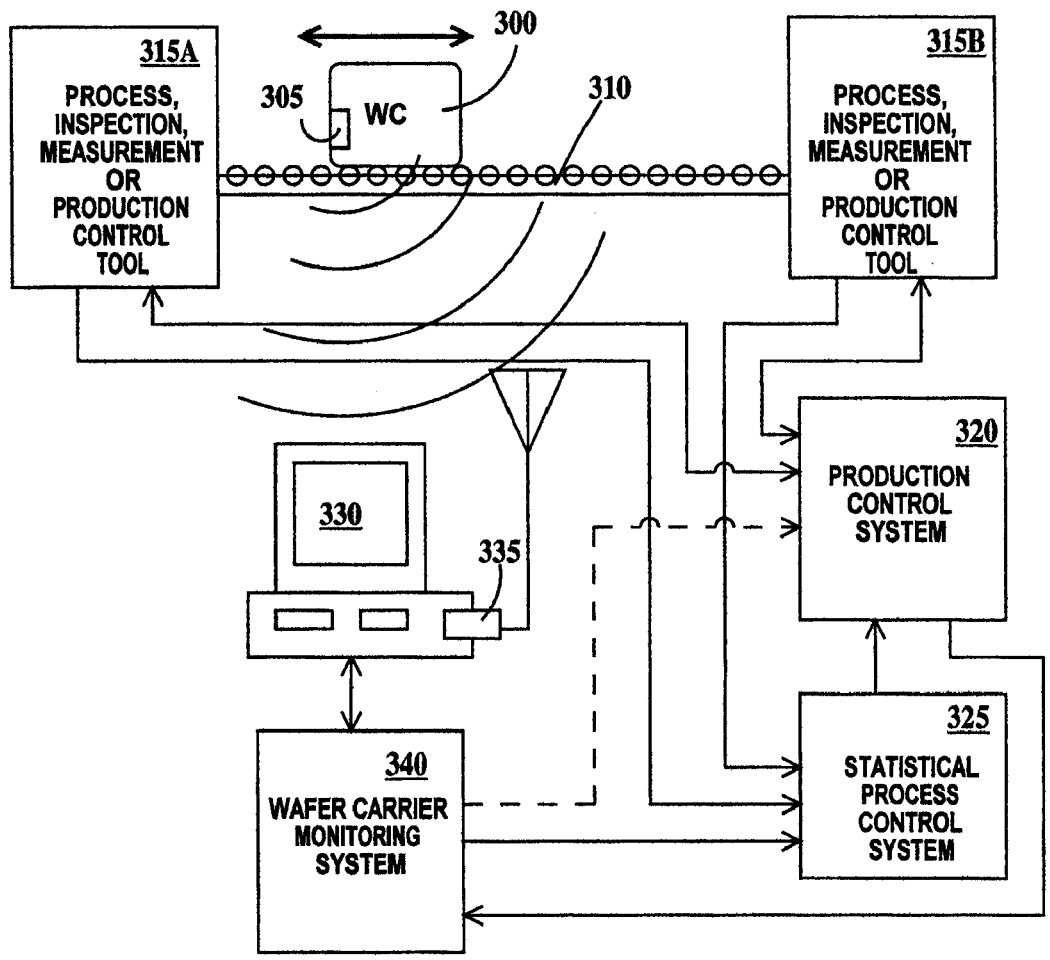
FIG. 6 is an exemplary schematic diagram illustrating the relationship between components of a manufacturing facility and elements of the present invention.

FIG. 6 is an exemplary schematic diagram illustrating the relationship between components of a manufacturing facility and elements of the present invention. In FIG. 6, a wafer carrier 300 having a micro-sensor 305, travels between a first manufacturing tool 315A and a second manufacturing tool 315B on an optional track 310. Hereafter, the term micro-sensor will incorporate standalone microsensors and micro-sensors coupled to one or more expansion cards. Micro-sensor 300 is similar to microsensors 140, 140A or 140B (see FIG. 5 and FIGS. 2A, 2C and 4C respectively) and expansion cards 145, 145A and 145B (see FIGS. 1A, 4A and 4C respectively) described supra. Wafer carrier 300 is similar to wafer carrier 100 (see FIGS. 1A and 1B) described supra. Track 310 is optional because wafer carrier 300 may be carried by a human operator or moved by a human operator on a cart. With very large wafers, such as 300 mm diameter wafers, mechanically unassisted transport of wafer carrier 300 becomes difficult due size and weight. Manufacturing tools 315A and 315B may be process tools (for fabrication of integrated circuits on wafers), wafer inspection tools, wafer measurements tool or production control tools such as wafer load/unload tools, wafer or wafer carrier storage buffers or wafer sorting tools.

Manufacturing tools 315A and 315B are linked to a production control system 320, which monitors the identity (ID) of wafer carrier 300 (and hence the lot of wafers contained in the wafer carrier) and tracks the wafer carriers location and time at location. In one example location is tracked by bar codes on the wafer carrier and bar code readers in manufacturing tools 315A and 315B. Production control system 320 also receives process parametric data from manufacturing tools 315A and 315B. If manufacturing tools are inspection or measurement tools (or generate wafer based inspection or measurement data) then the manufacturing tools may also be linked to a statistical process control (SPC) system 325. SPC system 325 analyzes wafer-based parametrics in order to determine if the wafer lot under manufacture is meeting specification. The results of this analysis may be fed back to production control system 320.

Micro-sensor 305 transmits the ID of wafer carrier 300 and sensor data from the micro-sensor 305. Micro-sensor 305 may monitor such exemplary attributes of the internal environment of the wafer carrier such temperature, pressure, humidity, particulate count, the presence of specific materials such as oxygen, hydrogen, chlorine and fluorine or other elemental gases, chemical gases such as ammonia, water vapor, hydrogen fluoride, hydrogen chloride, nitrogen oxides, silanes and solvents such as alcohols, ketones, esters, amines and chlorinated or fluoridated solvents within wafer carrier 300. Micro-sensor 305 may also monitor such exemplary events affecting the wafer carrier and wafers it contains such as vibration, accelerations, shocks experienced by wafer carrier 300. Micro-sensor 305 may also monitor other exemplary events such as intrusion of light (including UV, visible and IR), microwaves and the occurrence of electromagnetic events (i.e. EMI or static electric charge buildup) within wafer carrier 300. Micro-sensor 305 may also monitor electrostatic charging of wafer carrier 300. Any combination of the above may be monitored simultaneously.

The sensor data, collected and transmitted (broadcast) by micro-sensor 305 along with the ID of the wafer carrier (or the ID of the micro-sensor) is received by a receiving station 330. In one example, receiving station 330 is a computer having a micro-sensor adapter card 335. An example of a micro-sensor adapter card is the Mica2 radio module model MPR400CB mated to a Mote Interface Board model MIB500CA manufactured by Crossbow Technology, Inc. of San Jose Calif.

Receiving station 330 is linked to a wafer carrier monitoring system 340 which can receive data from production control system 320 and send data to SPC system 325. The link between production control system 320 and wafer carrier monitoring system 340 provides wafer carrier location information to the wafer carrier monitoring system via cross-reference to the ID of wafer carrier 300, the date/time stamp generated by manufacturing tools 315A and 315B and the recorded date/time that data packets are received from micro-sensor 305. Wafer carrier monitoring system 340 may have the capability to compare sensor readings to limits and generate a flag to production control system 320 directly via an optional link (dashed line) or using SPC system 325 as a conduit or SPC system 325 may compare the sensor data to limits and generate flags to the production control system. SPC system 325 is capable of performing analyses that are more complicated or require long-term analysis such as trend analysis. An example of data generated by wafer carrier monitoring system 340 is illustrated in TABLE I.

TABLE I

| LOT ID | DATE/TIME | LOCATION | SENSOR 1 | ... | SENSOR N | FLAG |
|---|---|---|---|---|---|---|
| 100A1 | Oct. 6, 2003 01:44:45 | TOOL A | 20.3° C. | | $O_2$ 0.0 ppm | 0 |
| 100A2 | Oct. 6, 2003 01:44:46 | TOOL B | 20.2° C. | | $O_2$ 0.0 ppm | 0 |
| 100A3 | Oct. 6, 2003 01:44:47 | TOOL C | 21.2° C. | | $O_2$ 5.8 ppm | 1 |
| . | | | | | | |
| . | | | | | | |
| . | | | | | | |
| 100A1 | Oct. 6, 2003 01:54:32 | TOOL A | 20.3° C. | | $O_2$ 0.0 ppm | 0 |
| 100A2 | Oct. 6, 2003 01:54:33 | TOOL B | 20.2° C. | | $O_2$ 0.0 ppm | 0 |
| 100A3 | Oct. 6, 2003 01:54:34 | TR A to D | 21.2° C. | | $O_2$ 0.3 ppm | 0 |

In the example of TABLE I, wafer carrier monitoring system, a flag against lot 100A3 at tool C on Oct. 6, 2003 at 01:44:47 could be sent to SPC system 340 and/or production control system 320.

Production control system 320, SPC system 325, receiving station 330 and wafer carrier monitoring system 340 may each be installed on different computers or share one or more computers.

Figure 7:
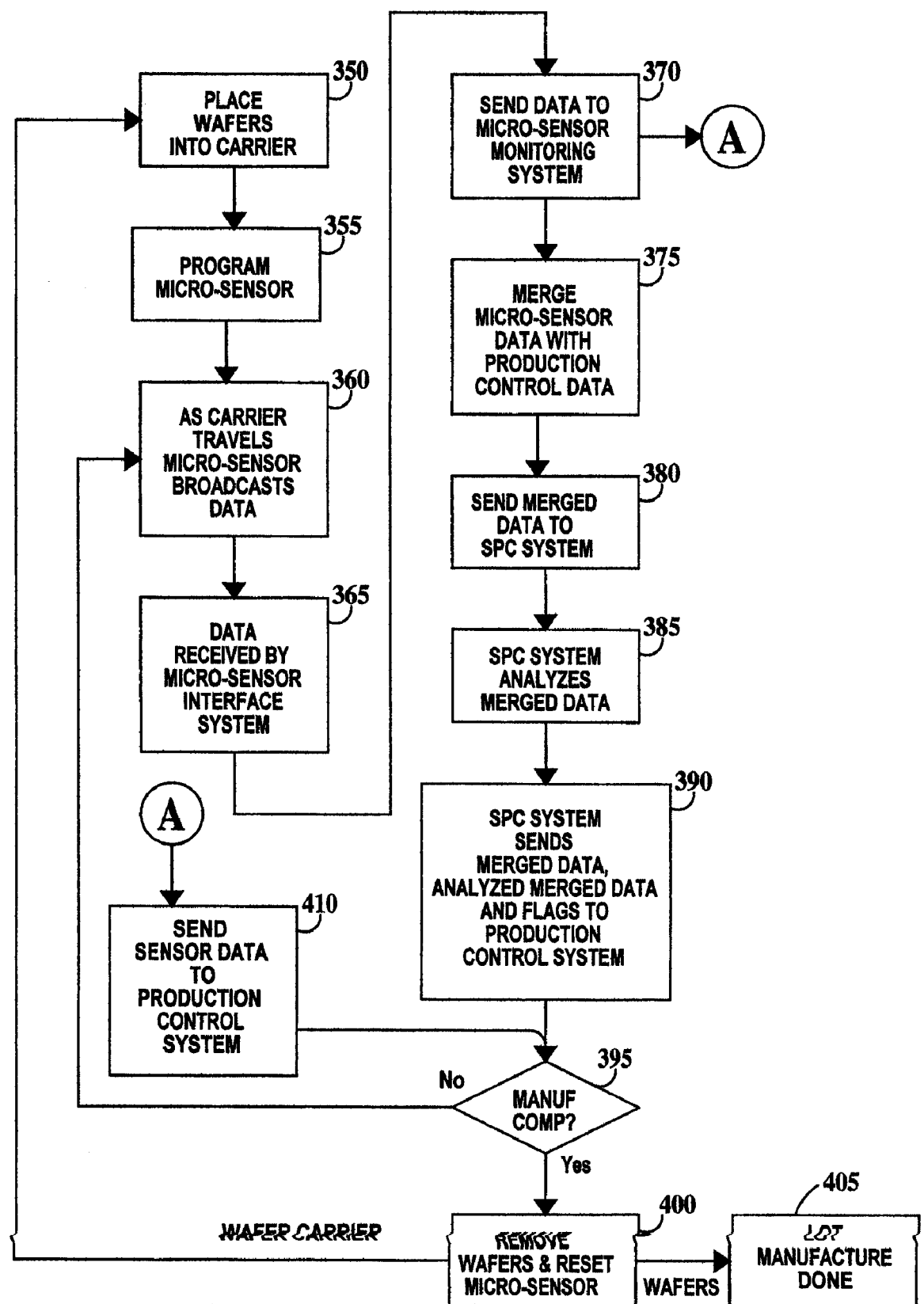
FIG. 7 is a flow diagram of the for monitoring the environment surrounding a product and events affecting the product while in the carrier during manufacture of the product.

FIG. 7 is a flow diagram of the method for monitoring the environment surrounding wafers and events affecting wafers while in a wafer carrier. In step 350, a lot of wafers is placed into the wafer carrier and a lot ID assigned to the wafer carrier. In step 355, the micro-sensor contained in the wafer carrier is programmed with the wafer lot ID or ID of the wafer carrier, the ID of the micro-sensor is recorded in wafer carrier monitoring system or the receiving station. In step 360, as the wafer carrier travels through the manufacturing line the micro-sensor broadcasts the ID information along with sensor data. In step 365 data is received by the micro-sensor interface system and date/time stamped. Steps 360 and 365 occur continuously or periodically in real-time.

In step 370, the sensor data and date/time stamp are sent to the micro-sensor monitoring system. In step 375, the micro-sensor monitoring system merges the sensor data with wafer carrier location information from the production control using the date/time stamps generated by each system as a cross-reference. The production control system knows when a wafer carrier enters or leaves a manufacturing tool and date/time stamps those events and knows from which manufacturing tool the wafer carrier came from and to which manufacturing tool the wafer carrier is going. If the wafer carrier is in a tool when the broadcast signal is received, the micro-sensor monitoring system records the tool ID. If the broadcast signal is received after the wafer carrier has left a tool but before it enters another tool, the micro-sensor monitoring system records the wafer carrier is in transit between the two tool IDs.

In step 380, merged data comprising location, date/time stamp, wafer carrier location and sensor data collected by the micro-sensor monitoring system is sent to the SPC system for analysis. SPC systems and their function are well known in the art. In step 390, the SPC system sends the merged data and/or any flags it generates to the production control system. In step 395, if the manufacturing process is complete, the method proceeds to step 400, otherwise the method loops back to step 360. In step 400, the micro-sensor is deprogrammed, the wafer carrier optionally cleaned, and the wafer carrier made available for reuse in step 350. In step 405 the manufacture of the wafers is complete and they may be shipped to a testing line and dice and pick manufacturing line, which may also incorporate the present invention.

Note, in some manufacturing lines, there is no SPC system. In these cases, the merged data may be sent to the production control system directly from step 370 and the processes performed in step 375 by the micro-sensor monitoring system are performed by the production control system in step 410. The method would then proceed to step 395.

Figure 8:
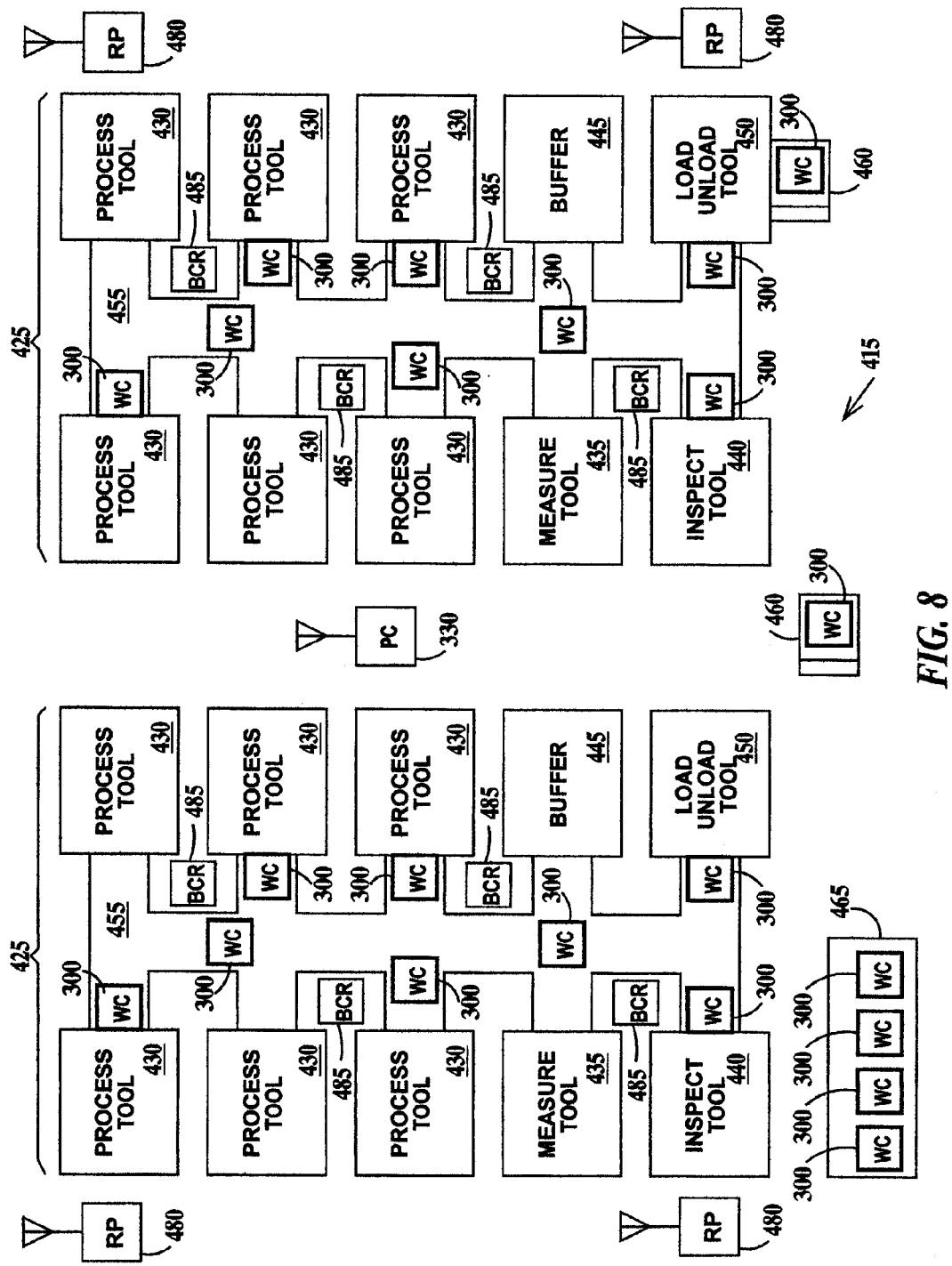
FIG. 8 is a diagram of an exemplary manufacturing facility incorporating the present invention.

FIG. 8 is a diagram of an exemplary manufacturing facility incorporating the present invention. In FIG. 8, manufacturing line 415 includes multiple production line segments 425. Each production line segment 425 include process tools 430, measurement tools 435, inspection tools 440, buffers 445 and load/unload tools 450 all linked to linked to production control and SPC systems as described supra and interconnected by a track 455. Receiving station 330 receives sensor data from a multiplicity of wafer carriers 300 docked at tools 430, 435, 440, 445 and 450, progressing along tracks 455, on carts 460 or in storage unit 465. In a very large line manufacturing line, where the distance between any given wafer carrier 300 and receiving station 330 can exceed the transmit (and/or receive) range of the micro-sensor in the wafer carrier, a multiplicity of repeaters 480 are supplied which receive sensor data and send the data to receiving station 300. Additionally a set of optional bar code readers 485 linked to the production control system may be distributed along tracks 455 to further refine the location of wafer carriers in transit between tools. When a carrier is placed on a cart 460 or storage 465, its location may also be sent to the production control system.

It should be understood that all wafer carriers or just a selected number of wafer carriers in a manufacturing line need be equipped with micro-sensors. For example, if only random EMI events are being monitored, then a few micro-sensor equipped wafer carriers traveling throughout the manufacturing line are sufficient. Further, not all micro-sensor equipped wafer carriers need have the same micro-sensor. For example, some wafer carriers could have a micro-sensor adapted to sense temperature and some wafer carriers could have micro-sensors adapted to sense vibration.

Figure 9:
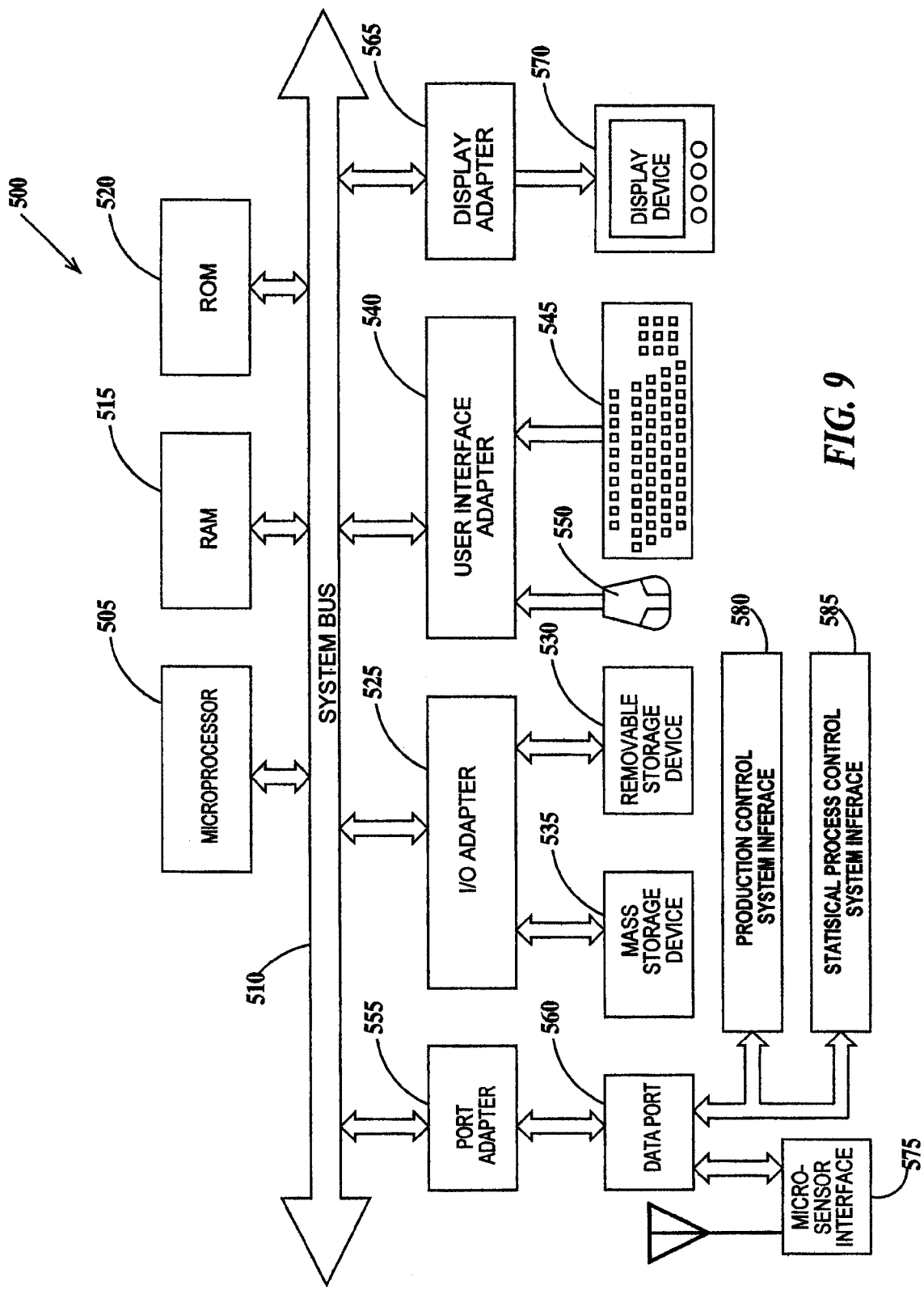
FIG. 9 is a schematic block diagram of a general-purpose computer modified for practicing the present invention.

FIG. 9 is a schematic block diagram of a general-purpose computer modified for practicing the present invention. Generally, the method described herein with respect to monitoring the environment surrounding a product and events affecting the product carrier and the product in the product carrier during manufacture of the product is practiced with a general-purpose computer or one or more linked general purpose computers and the method may be coded as a set of instructions on removable or hard media for use by the one or more general-purpose computers.

The general-purpose computer FIG. 9 is a schematic block diagram of a general-purpose computer modified for practicing the present invention, specifically for use as a receiving station and wafer carrier monitoring system. In FIG. 9, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In FIG. 9, a micro-sensor interface 575, a production control system interface 580 and an SPC interface 585 are connected to data port 560. The production control system and SPC system are each general-purpose computer systems similar to computer system 500. In operation, information for or the computer program created to run the present invention is loaded on the appropriate removable data and/or program storage device 530, fed through data port 560 or typed in using keyboard 545.

Thus, the present invention provides an apparatus, method and system for monitoring the environment surrounding a product in a product carrier and events affecting the product carrier and the product in the product carrier during manufacture of the product.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the data collected by some microsensors may not be broadcast, but read out by plugging the micro-sensor into a port on a computer and downloading the data to an appropriate control or monitoring system. In a further example, micro sensors may be mounted on the outside of the wafer carrier and provision made for an opening for the sensor portion of the microsensor to have access to the interior of the product carrier. Therefore, it is intended that the following claims cover all such modifications and changes as fall within the true spirit and scope of the invention.

What is claimed is:

1. An apparatus, comprising:
   a product carrier adapted to transport product undergoing manufacture; and
   a first device adapted to sense an attribute of an environment within said product carrier; and
   a second device adapted to encode data relating to said attribute and to actively and wirelessly transmit said data.

2. The apparatus of claim 1, wherein said second device includes a radio transmitter.

3. The apparatus of claim 2, wherein said first device and said second device are contained within said product carrier.

4. The apparatus of claim 1, wherein said first device and said second device are integral with each other.

5. The apparatus of claim 1, wherein said product carrier is adapted to be scaled against the surrounding atmosphere of a manufacturing facility that said product is being manufactured in.

6. The apparatus of claim 1, wherein said second device is programmable with a unique product carrier identity and is adapted to transmit said product carrier identity with said data relating to said attribute.

7. The apparatus of claim 1, further including additional devices, each additional device adapted to sense one or more additional attributes of the environment within said product carrier.

8. The apparatus of claim 7, wherein said second device is adapted to encode data relating to said attributes sensed by said additional devices and actively and wirelessly transmit said data related to said additional attributes.

9. The apparatus of claim 1, wherein said attribute of said environment within said product carrier is selected from the group of attributes consisting of temperature, pressure, humidity, particulate count and the presence of fluoride, a gas or vapor within said product carrier.

10. The apparatus of claim 9, wherein said gas or vapor is selected from the group consisting of oxygen, hydrogen, chlorine, other elemental gases, ammonia, water, hydrogen fluoride, hydrogen chloride, nitrogen oxides, silanes, alcohols, ketones, esters, amines, solvents, chlorinated solvents and fluoridated solvents.

11. The apparatus of claim 1, wherein said product within said product carrier is selected from the group consisting of a semiconductor substrate, a wafer, a photolithography mask, a photolithography reticule, a semiconductor module, a semiconductor package, a circuit board, a magnetic disk, a magnetic hard drive disk, a magnetic floppy disk, a laser disk, a compact disk, a digital video disk, an optical disk, a lens and a mirror.

12. The apparatus of claim 1, wherein said second device comprises a radio transceiver.

13. The apparatus of claim 1, further including a wireless receiving station for receiving said data from said second device.

14. The apparatus of claim 13, wherein said wireless receiving station is a radio receiver.

15. The apparatus of claim 1, wherein said second device is adapted to transmit a date/time stamp with said data relating to said attribute.

16. The apparatus of claim 1, wherein said second device is adapted to receive programming signals.

17. The apparatus of claim 1, wherein said second device is adapted to receive control signals.

18. The apparatus of claim 17, wherein said control signals are selected from the group consisting of on, off, reset, test and poll instructions.

19. The apparatus of claim 1, further including a third device connected to said first and second devices, said third device including physical contacts to temporarily connect an external device to said first and second devices.

20. The apparatus of claim 1, wherein one or both of said first and said second devices are self-powered.

21. An apparatus, comprising:
    a product carrier adapted to transport product undergoing manufacture; and
    a first device adapted to sense an event affecting said product within said product carrier; and
    a second device adapted to encode data relating to said event and to actively and wirelessly transmit said data.

22. The apparatus of claim 21, wherein said event occurring to said product while within said product carrier comprises an electromagnetic, electrostatic or magnetic event.

23. The apparatus of claim 22, wherein said electromagnetic, electrostatic or magnetic event includes the intrusion of visible light, ultra-violet light, infrared light, microwaves, into said product carrier and static electric charge build within said product carrier.

24. The apparatus of claim 21, wherein said event occurring to said product while within said product carrier is selected from the group consisting of vibration, acceleration and shock up.

25. The apparatus of claim 21, wherein said event excludes logistic and production control events.

* * * * *

UNITED STATES PATENT AND TRADEMARK OFFICE
CERTIFICATE OF CORRECTION

PATENT NO. : 6,993,405 B2  Page 1 of 1
APPLICATION NO. : 10/605912
DATED : January 31, 2006
INVENTOR(S) : Beaulieu et al.

It is certified that error appears in the above-identified patent and that said Letters Patent is hereby corrected as shown below:

Column 4
Line 55, delete "Mica2 Dot" and insert --Mica2Dot--
Line 63, delete "my" and insert --may--

Column 9
Line 48, delete "scaled" and insert --sealed--

Column 10
Line 2, delete "fluoride,"

Signed and Sealed this

Twenty-ninth Day of May, 2007

JON W. DUDAS
*Director of the United States Patent and Trademark Office*